United States Patent [19]

Chia et al.

[11] Patent Number: 5,262,927
[45] Date of Patent: Nov. 16, 1993

[54] PARTIALLY-MOLDED, PCB CHIP CARRIER PACKAGE

[75] Inventors: Chok J. Chia, Campbell; Seng-Sooi Lim, San Jose, both of Calif.

[73] Assignee: LSI Logic Corporation, Milpitas, Calif.

[21] Appl. No.: 834,182

[22] Filed: Feb. 7, 1992

[51] Int. Cl.⁵ .............................. H05K 1/11
[52] U.S. Cl. .................... 361/784; 257/666; 257/678; 257/787; 257/707; 361/717; 361/728; 361/764; 361/813
[58] Field of Search ............. 174/16.3, 52.4; 361/383, 386, 392, 401, 412, 414, 421; 439/68, 70, 55; 257/666-674, 678-679, 700, 724, 777, 793, 797

[56] References Cited

U.S. PATENT DOCUMENTS

| | | | |
|---|---|---|---|
| 3,405,441 | 10/1968 | Asher et al. | 29/627 |
| 3,909,838 | 9/1975 | Beyerlein | 357/70 |
| 4,143,456 | 3/1979 | Inoue | 29/588 |
| 4,264,917 | 4/1981 | Ugon | 357/74 |
| 4,300,153 | 11/1981 | Hayakawa et al. | 357/80 |
| 4,330,790 | 5/1982 | Burns | 357/70 |
| 4,363,076 | 12/1982 | NcIver | 361/386 |
| 4,507,675 | 3/1985 | Fujii et al. | 357/70 |
| 4,594,770 | 6/1986 | Butt | 29/588 |
| 4,763,188 | 8/1988 | Johnson | 174/52.4 |
| 4,857,483 | 8/1989 | Steffen et al. | 437/209 |
| 4,872,825 | 10/1989 | Ross | 425/117 |
| 4,874,722 | 10/1989 | Bednarz et al. | 437/209 |
| 4,890,152 | 12/1989 | Hirata et al. | 357/72 |
| 4,913,930 | 4/1990 | Getson | 427/58 |
| 4,955,132 | 9/1990 | Ozawa | 29/840 |
| 4,961,105 | 10/1990 | Yamamoto | 357/72 |
| 4,969,225 | 8/1990 | Sagisaka et al. | 361/414 |
| 4,974,057 | 11/1990 | Tazima | 357/72 |
| 4,975,765 | 12/1990 | Ackermann et al. | 357/80 |
| 4,982,265 | 1/1991 | Watanabe et al. | 357/75 |
| 4,984,059 | 1/1991 | Kubota et al. | 357/68 |
| 4,996,587 | 2/1991 | Hinrichsmeyer et al. | 357/74 |
| 5,012,386 | 4/1991 | McShane et al. | 361/401 |
| 5,025,114 | 6/1991 | Braden | 174/52.4 |
| 5,051,813 | 9/1991 | Schneider et al. | 357/72 |

Primary Examiner—Gregory D. Thompson
Attorney, Agent, or Firm—Gerald E. Linden; Michael D. Rostoker

[57] ABSTRACT

A dambar-less leadframe is sandwiched between two printed circuit boards (PCBs). The PCBs form a major portion of the package body, and isolate the leadframe leads from plastic molding compound. In one embodiment, an upper PCB (substrate) is formed as a square ring, having an opening containing a heat sink element. A lower PCB is also formed as a square ring, and has a smaller opening for receiving a die. The back face of the die is mounted to the heat sink. The exposed front face of the die is wire bonded to inner ends of conductive traces on the exposed face of the lower PCB. The outer ends of the traces are electrically connected to the leadframe leads by plated-through vias extending through the two PCBs. The plated-through vias additionally secure the sandwich structure together. Plastic molding compound is injection/transfer molded over the front face of the die and the bond wires, forming a partially-molded package. In another embodiment, the upper PCB is a solid planar element, and is not provided with an opening for a heat sink. The back face of the die is mounted to the inside surface of the upper PCB.

11 Claims, 3 Drawing Sheets

PARTIALLY-MOLDED, PCB CHIP CARRIER PACKAGE

TECHNICAL FIELD OF THE INVENTION

The invention relates to the packaging of integrated circuit (IC) semiconductor devices (chips), especially to high pin count packages formed by injection or transfer molding.

BACKGROUND OF THE INVENTION

Packages provide the interconnect from a chip to a printed circuit board (PCB). The package also provides protection for the chip from the environment. The overall objective of the package design is to provide these features at the lowest possible manufacturing cost.

A common process employed in semiconductor packaging is wire bonding, wherein a fine wire is connected between semiconductor die pads and inner ends of package lead fingers.

In one packaging scheme, a semiconductor die is mounted within an opening in a package having external leads (or pins). Bond pads on the die are wired to terminals within the package, and a lid is mounted over the opening containing the die. This type of package is usually formed of ceramic, and is relatively expensive to manufacture.

Another technique for packaging integrated circuit devices is mounting the die to a die attach pad on a lead frame, connecting the die to various inner lead fingers of the lead frame, and encapsulating the die, either with epoxy or with a plastic molding compound. Plastic packages are preferred by most commercial users for their low cost and low weight. Plastic packaging is discussed in the main, hereinafter.

As chips become more complex, their packages require more pins (or external leads), and hence become larger in size. Transfer molding large plastic packages involves the transfer of large amounts of melted plastic, and the injection of the plastic can cause bond wires connecting the chip to the leadframe to move and short against each other (wire sweep). Also, because of the set cure characteristics of plastic molding compound, a large molded body has a tendency to warp, causing difficulties when packages are mounted to a PCB.

Molding the entire package body ("fully molded") usually requires that the leadframe has a "dambar", namely a continuous ring of metal surrounding the body that prevents the plastic from flowing out of the mold cavity between the external leads of the leadframe. The dambar then has to be removed to isolate individual leads before the package is usable. With high pin count packages, the leads are often delicate and spaced closely (fine pitch), resulting in the need for very fine precision tooling for the trimming operation. This type of tooling is also very expensive, which adds to the overall cost of packaging.

Molding of the plastic around the leadframe also causes some leakage of the plastic onto the leadframe (flashing). The flash then has to be removed in a separate de-flashing (dejunking) step.

Attention is directed to commonly-owned U.S. Pat. No. 5,051,813, entitled PLASTIC-PACKAGED SEMICONDUCTOR DEVICE HAVING LEAD SUPPORT AND ALIGNMENT STRUCTURE, which discloses plastic packaging with and without dambars, dejunking, etc.

In the main, hereinafter, molding where the mold gate is disposed at the parting plane of the two mold halves is discussed, as most pertinent to the present invention.

The following U.S. Pat. Nos. are cited of general interest in the field of packaging (annotations in parentheses): 3,405,441 (hermetic sealing process using glass and metal lid on a ceramic substrate); 3,909,838 (package formed by sealing two halves or pre-molded body around a molded pill package bonded to a leadframe); 4,143,456 (glob top sealing devices mounted on a substrate); 4,264,917 (silicon substrate with glob top encapsulation); 4,300,153 (TAB device with a substrate bonded to the bottom of the die; glob top encapsulation); 4,330,790 (tape-mounted device encapsulated using a metal carrier and epoxy); 4,363,076 (flat TAB assembly); 4,507,675 (molded heatsink package); 4,594,770 (bonding a metal cap and a plastic cap around a leadframe); 4,857,483 (mold gate is not located at the parting plane of the mold halves); 4,872,825 (encapsulation method using a lamination process instead of injection or transfer molding); 4,874,722 (pre-molded flatpack encapsulated with silicone gel; dambar required; not encapsulated by molding); 4,890,152 (molded pin grid array package; not a surface mount flatpack construction); 4,913,930 (coating and encapsulating a device in a reel-to-reel format); 4,955,132 (flip chip mounting to a substrate); 4,961,105 (die back metallization); 4,974,057 (die coated with resin and then molded); 4,975,765 (high density flatpack with edge connectors; not a molded package); 4,982,265 (stackable TAB); 4,984,059 (leadframe tips overlap the top of the die surface); 4,996,587 (thin, stackable package); and 5,025,114 (leadframe construction resulting in multilayer structure for plastic packages).

DISCLOSURE OF THE INVENTION

It is therefore an object of the present invention to provide an improved technique for packaging a die.

It is another object of the present invention to provide a packaging technique that is relatively inexpensive and relatively easy to manufacture, and reliable.

It is another object of the present invention to provide a packaging technique that does not rely on expensive tooling for trimming dambars, that does not rely on additional tooling for dejunking, and the like.

It is another object of the present invention to provide a plastic packaging technique that minimizes wire sweep, and allows for tighter lead-to-lead spacing and increased pin count.

According to the invention, a dambar-less leadframe is sandwiched between two printed circuit boards (PCBs). The PCBs form a major portion of the package body, and isolate the leadframe leads from plastic molding compound.

In one embodiment of the invention, an upper PCB (substrate) is formed as a square ring, having an opening containing a heat sink element. A lower PCB is also formed as a square ring, and has a smaller opening for receiving a die. The back face of the die is mounted to the heat sink. The exposed front face of the die is wire bonded to inner ends of traces on the exposed face of the lower PCB. The outer ends of the traces are electrically connected to the leadframe leads by plated-through vias extending through the two PCBs. The plated-through vias additionally secure the sandwich structure together. Plastic is injection/transfer molded over the front face of the die and the bond wires, forming a partially-molded package.

In another embodiment of the invention, the upper PCB is a solid planar element, and is not provided with an opening for a heat sink. The back face of the die is mounted to the inside surface of the upper PCB.

Other objects, features and advantages of the invention will become apparent in light of the following description thereof.

BRIEF DESCRIPTION OF THE DRAWINGS

FIG. 1 is a section taken on lines 1—1 of FIG. 2.

DETAILED DESCRIPTION OF THE INVENTION

Figure 1:
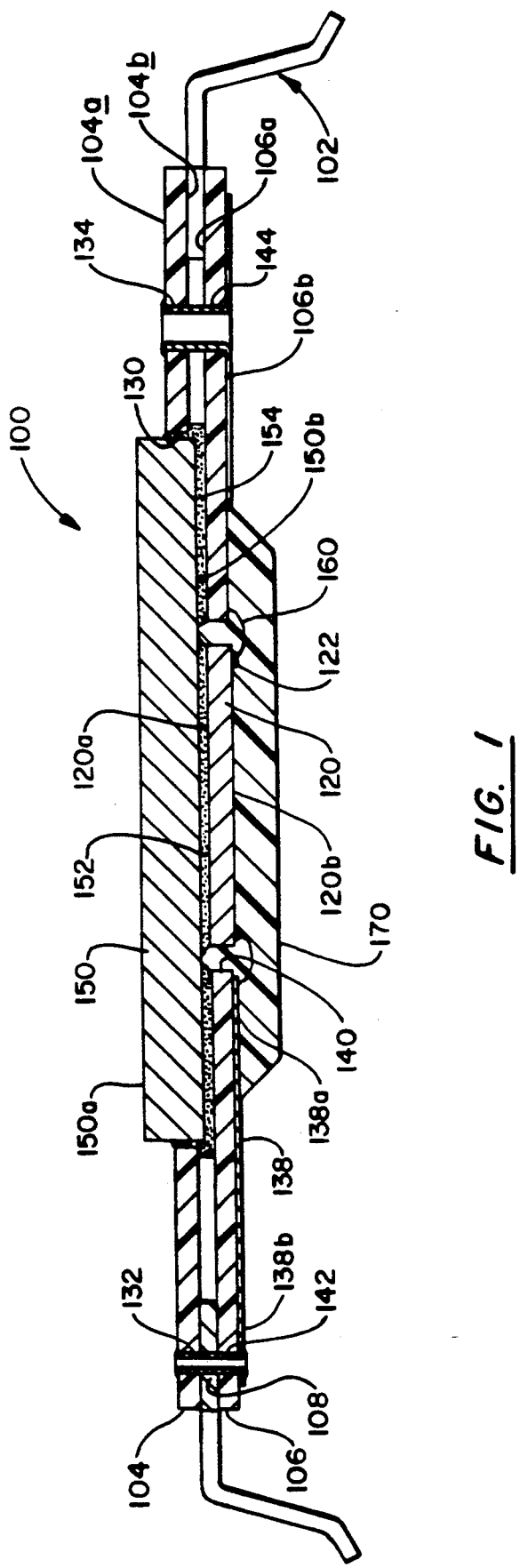
FIG. 1 is a cross-sectional view of a first embodiment of the partially-molded PCB chip carrier of the present invention.
Figure 2:
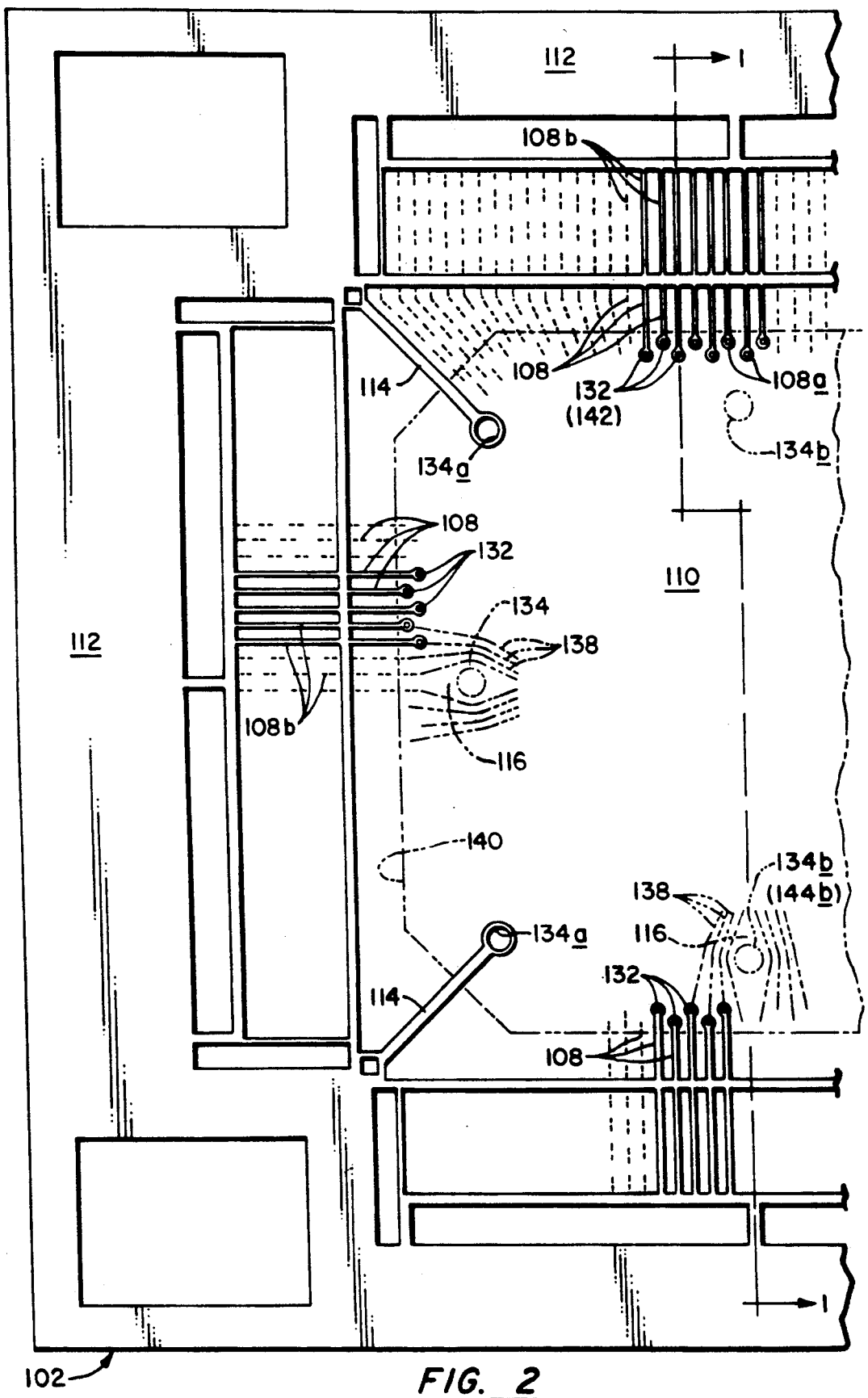
FIG. 2 is a plan view of the leadframe element of the chip carrier of FIG. 1, at an earlier stage of fabrication.

FIGS. 1 and 2 show a molded PCB chip carrier package 100, according to the present invention.

With particular reference to FIG. 1, the completed package 100 is essentially a sandwiched construction, wherein a leadframe 102 (shown in FIG. 2) is disposed between two printed circuit boards (PCBs) - an upper PCB (or substrate) 104 and a lower PCB (or substrate) 106. The PCBs 104 and 106 constitute a major portion of what is ultimately to become the package "body".

The upper PCB 104 has an upper, exterior surface 104a and a lower, interior surface 104b. Similarly, the lower PCB 106 has an upper, interior surface 106a and a lower, exterior surface 106b.

With particular reference to FIG. 2, the leadframe 102 is a fairly standard affair, in that it includes a plurality of closely-spaced, fine gauge leads 108 extending from a square central area 110 to an outer support ring 112. A semiconductor die 120 (See FIG. 1) is ultimately electrically connected to inner ends 108a of the leads 108. Whereas in the prior art, the die is usually connected with bond wires directly to the inner ends of the leads 108, according to the present invention the die is connected indirectly through the intermediary of the PCB 106 to the leads 108, as discussed in greater detail hereinafter.

The die 120 has an upper (as viewed in FIG. 1) surface 120a which is the "back" side (face) of the die, and has a lower (again, as viewed) surface 120b which is the "front" side of the die and contains circuit elements (not shown) and bond pads 122.

The upper PCB 104 is formed generally as a square ring, having a central square opening 130 extending fully through the board. The opening is preferably substantially larger, such as 0.200 inch larger, than the size of the die 120. For purposes of this discussion, it is assumed that dies are square and, as used herein, the term "square" should be taken to mean any shape die, such as rectangular.

A number "n" of through holes 132 are disposed about the periphery of the upper PCB 104. The number "n" corresponds to the number of leads 108 in the leadframe, and each through hole 132 is disposed to align with a particular lead 108 of the leadframe.

The through holes 132 are, if necessary, disposed in two or more offset rows about the periphery of the upper PCB to accommodate the close spacing of the leads. (Two offset rows of holes 132 are shown in FIG. 2.) For example, with 0.008 inch leads spaced apart on the order of 0.020 inches, and through holes 132 having a diameter on the order of 0.020 inches, it would simply be impossible to accommodate one through hole per lead with just a single row of through holes 132 extending around the periphery of the upper PCB 104 (shown in phantom in FIG. 2).

Optionally, as shown, the upper PCB 104 is also provided with a few additional through holes 134, disposed inwardly (nearer the opening 130) of the through holes 132. These through holes 134 are preferably disposed evenly about the upper PCB, taking care to avoid alignment with leads 108. Rather, they may be aligned with (corner) tiebars 114 of the leadframe, such as is the case with the four corner-aligned through holes 134a. Or, the leadframe can be modified so that there is a suitable lead-free "void" 116 aligned with the four side edge through holes 134b.

The upper PCB 104 is shown devoid of wiring patterns (conductors; traces). However, it could be provided with a metal power or ground plane foil, preferably on its upper surface 104a, which could be segmented.

The lower PCB 106 is also formed generally as a square ring, having a central square opening 140 extending fully through the board. The opening is larger, such as 0.025 inch larger than the size of the die 120.

A number "n" of through holes 142 are disposed about the periphery of the lower PCB 106. The through holes 142 in the lower PCB 106 are aligned with the through holes 132 in the upper PCB 104. Again, the number "n" corresponds to the number of leads 108 in the leadframe, and each through hole 142 is disposed to align with a particular lead 108 of the leadframe. Again, the through holes 142 are, if necessary, disposed in two or more offset rows about the periphery of the lower PCB 106 to accommodate high density leads 108.

Optionally, as shown, the lower PCB 106 is also provided with a few additional through holes 144, as was the upper PCB (i.e., through holes 134), disposed inwardly of the through holes 142. These through holes 144 are preferably disposed evenly about the lower PCB, taking care to avoid alignment with leads 108. Rather, they are aligned with tiebars 114 of the leadframe, such as is the case with the four corner through holes 144a. Or, as mentioned above (with respect to the through holes 134) the leadframe can be modified so that there is a suitable lead-free "void" 116 aligned with the four side edge through holes 144b.

Whereas the upper PCB 104 did not have conductive lines, the lower PCB is provided with a wiring layer of conductors (traces) 138. These conductors 138 each extend from a respective through hole 142 towards the inner periphery of the lower PCB, preferably to within 0.010 inches of the opening 140 so as to be adjacent the die 120. The conductors 138 are electrically connected to the through holes 142. A preferred method of making this connection is simply plating the through holes 142 (and 132). In essence, the through holes 132 and 142 are simply formed as plated through vias, a well known technique. Inner ends 138a of the conductors 138 are left exposed, for connecting to the die 120. The remaining, outward portions 138b of the conductors 138 are preferably coated with solder mask material, for purposes of electrical insulation.

As shown in FIG. 2, the conductors 138 are laid out (routed) to form a void 116 for the optional through holes 134b and 144b.

In the embodiment shown in FIGS. 1 and 2, the upper PCB 104 is a square ring with a central opening 130 larger than the opening 140 in the lower PCB 106. A square heat sink 150 is disposed in the opening 130, and since the opening 140 in the lower PCB 106 is smaller than the heat sink, the upper surface 106a of the lower PCB 106 acts as a "stop" against further insertion of the heat sink. The heat sink has an upper surface 150a and a lower surface 150b, and is suitably simply a flat plate-like member, although it could be provided with fins or other heat-spreaders on its exposed surface 150a, and is preferably formed of copper, or other suitable thermally conductive sink material.

The die 120 is disposed within the hole 140 in the lower PCB 106, and comes to rest against the lower surface 150b of the heat sink 150. An adhesive 152 is preferably used to secure the back side (upper surface) 120a of the die 120 to the inner face (bottom surface) 150b of the heat sink. The adhesive is preferably thermally conductive, and the intimate juxtaposition of the die to the heat sink allows for effective thermal dissipation. A suitable adhesive is Ablebond 84-1LMIS, available from Ablestick Laboratories.

As mentioned hereinabove, the package 100 is a sandwich-like construction. To assemble the package, the leadframe 102 is interposed between the upper and lower PCBs, and the holes through 132 and 142, and optionally 134 and 144, are plated, forming (if you will) "rivets" extending through the through holes, from one PCB to the other PCB, and electrically connecting the through holes 132 and 142 to respective leadframe conductors 108.

The next stage of assembly would be inserting the heat sink 150 into the opening 130, and the heat sink may be secured by a suitable adhesive 154 adhering the bottom surface 150b of the heat sink 150 to the upper surface 106a of the lower PCB. Advantageously, the periphery of the heat sink is also sealed (and incidentally adhered) to the inner edge of the opening 130 in the upper PCB 104 by the adhesive 154.

Next, the die is mounted to the heat sink, as discussed hereinabove, and is connected to the lead frame conductors with bond wires 160.

Finally, plastic 170 is molded about the front face (bottom surface) 120b of the die, including over the bond wires 160, and completely covering the opening 140 in the lower PCB 106. Preferably, the plastic 170 extends sufficiently along the lower surface 106b of the lower PCB 106 to cover the exposed ends 138a of the conductors 138. The molding of the plastic 170 is suitably performed in a transfer molding process, wherein the entire package is mounted between two mold halves, and liquid molding compound is introduced, via a mold gate at the parting plane of the mold halves, into a mold cavity.

Hence, it is seen that molding of plastic is done around the chip only, and a central portion of the PCB 106. The molding compound (plastic) does not contact the leadframe, so there is no need for a dambar, there is no need for removing a dambar, and there is no need for dejunking excess plastic from the leads 108 or from between leadframe leads. By avoiding a dambar, trimming and dejunking, cost is reduced and closer lead spacing can be achieved.

The package is targeted as a replacement for fully-molded plastic packages, especially those having high pin counts, although its utility is not limited thereto. By molding only a small portion of the package body, the amount of plastic molding compound required is reduced, allowing a high degree of flexibility in mold gate design and diminishing wire wash problems.

The package is not restricted in size by molding technology This, together with the ability to space the leads closer together allows for much higher pin count packages than is otherwise possible with standard (fully) molded packages.

As noted above, fins or other heat-spreaders can readily be added to the heatsink, and the PCB 106 can be made of multilayer construction to allow for more complex electrical connections, such as crossover traces and mounting external components to the PCB.

ALTERNATE EMBODIMENT

Figure 3:
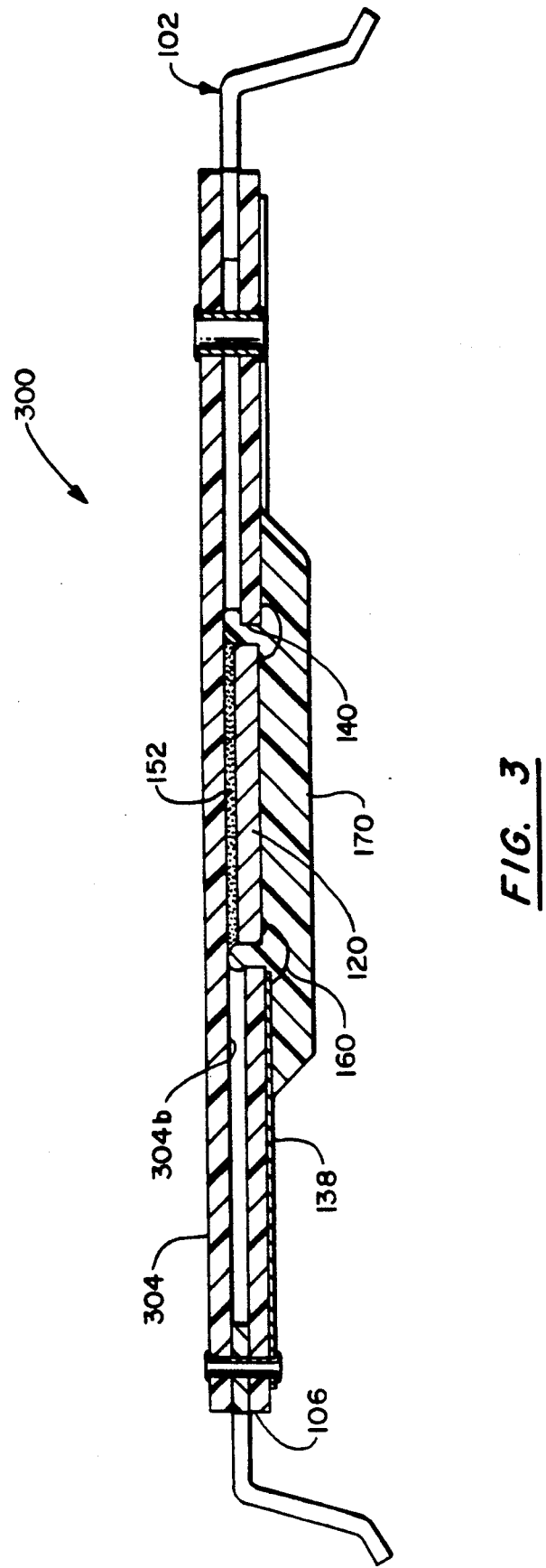
FIG. 3 is a cross-sectional view of another embodiment of the partially-molded PCB carrier of the present invention.

FIG. 3 shows an alternate embodiment 300 of the partially-molded PCB package of the present invention. In this embodiment, the upper PCB (or substrate) 304 is formed as a simple planar element, without a central opening 130. Evidently, there is also no heat sink 150.

As shown in FIG. 3, the die 120 is mounted directly to the underside 304b of the upper PCB 304.

Also, in the embodiment of FIG. 3, the leadframe leads 108 can be longer than in the FIG. 1 embodiment, and can extend more fully towards the opening 140 in the lower PCB 106.

Generally, this embodiment provides the same advantages and benefits as the previous embodiment. Of course, this embodiment lacks the integral heatsink element 150.

It should be understood that the package, sans die and molding compound, forms a useful product in the semiconductor industry, wherein a manufacturer would separately produce or have produced the sandwiched assembly of PCBs and leadframe, and subsequently mount and electrically connect the die within the package, and encapsulate the die with the plastic molding compound.

What is claimed is:

1. Chip carrier package, comprising:
   an upper substrate having an upper surface and a lower surface;
   a lower substrate having an upper surface and a lower surface;
   an opening extending through the lower substrate;
   a leadframe interposed between the lower surface of the upper substrate and the upper surface of the lower substrate, the leadframe contacting the lower surface of the upper substrate and the upper surface of the lower substrate, and having leads extending from an outer periphery of the lower substrate towards the opening in the lower substrate;
   a semiconductor die having a front face containing circuit elements and a back face, and mounted in the opening in the lower substrate;
   wiring traces disposed on the lower surface of the lower substrate, and extending from an outer periphery of the lower substrate to adjacent the opening in the lower substrate;
   means for electrically connecting the circuit elements to inner ends of the wiring traces;
   means for electrically connecting outer portions of the wiring traces to the leadframe leads; and plastic molding compound disposed over the front face of the die and extending partially over the lower surface of the lower substrate.

2. Chip carrier package, according to claim 1, wherein:
the means for electrically connecting the circuit elements to inner ends of the wiring traces is bond wires.

3. Chip carrier package, according to claim 1, wherein:
the means for electrically connecting the outer portions of the wiring traces to the leadframe leads is at least one row of plated through holes extending through outer peripheral portions of the upper and lower substrates.

4. Chip carrier package, according to claim 3, wherein:
at least two rows of plated through holes are disposed about the outer peripheral portions of the upper and lower substrates, and each row of through holes is offset from the remaining rows of plated through holes.

5. Chip carrier package, according to claim 3, further comprising:
additional through holes extending through the upper and lower substrates;
wherein:
the additional through holes are plated; and
the additional through holes are electrically isolated from the leadframe leads.

6. Chip carrier package, according to claim 1, wherein:
the upper substrate is provided with a central opening;
a heatsink element is disposed within the central opening in the upper substrate; and
the back face of the semiconductor die is adhered to the heatsink.

7. Chip carrier package, according to claim 1, wherein:
the back face of the semiconductor die is adhered to the lower surface of the upper substrate.

8. Chip carrier comprising:
an upper substrate having an upper surface and a lower surface;
a lower substrate having an upper surface and a lower surface;
an opening extending through the lower substrate for receiving a semiconductor die;
a leadframe interposed between the lower surface of the upper substrate and the upper surface of the lower substrate, the leadframe contacting the lower surface of the upper substrate and the upper surface of the lower substrate, and having lead extending from an outer periphery of the lower substrate towards the opening in the lower substrate;
wiring traces disposed on the lower surface of the lower substrate, and extending from an outer periphery of the lower substrate to adjacent the opening in the lower substrate;
and
means for electrically connecting outer portions of the wiring traces to the leadframe leads;
wherein:
a completed package is formed by mounting a die in the opening, connecting the die to inner ends of the wiring traces and disposing plastic molding compound over the die and partially over the lower surface of the lower substrate.

9. Chip carrier, according to claim 8,
the means for electrically connecting the outer portions of the wiring traces to the leadframe leads is at least one row of plated through holes extending through outer peripheral portions of the upper and lower substrates.

10. Chip carrier, according to claim 9, wherein:
at least two rows of plated through holes are disposed about the outer peripheral portions of the upper and lower substrates, and each row of through holes is offset from the remaining rows of plated through holes.

11. Chip carrier, according to claim 9, further comprising:
additional through holes extending through the upper and lower substrates;
wherein:
the additional through holes are plated; and
the additional through holes are electrically isolated from the leadframe leads.

* * * * *